United States Patent
Lee et al.

(10) Patent No.: US 7,205,876 B2
(45) Date of Patent: Apr. 17, 2007

(54) INDUCTOR FOR RADIO FREQUENCY INTEGRATED CIRCUIT

(75) Inventors: Kwang-du Lee, Seoul (KR); Hoon-tae Kim, Yongin (KR); Gea-ok Cho, Yongin (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 142 days.

(21) Appl. No.: 10/660,801

(22) Filed: Sep. 12, 2003

(65) Prior Publication Data
US 2004/0119574 A1   Jun. 24, 2004

(30) Foreign Application Priority Data
Sep. 13, 2002   (KR) ............... 10-2002-0055634

(51) Int. Cl.
*H01F 5/00* (2006.01)
(52) U.S. Cl. .................... 336/200; 336/225
(58) Field of Classification Search ........ 336/200, 336/223, 225; 257/531, 701, 750–752
See application file for complete search history.

(56) References Cited

U.S. PATENT DOCUMENTS

| 3,638,156 | A  | * | 1/1972  | West .................. 336/200 |
| 6,002,161 | A  |   | 12/1999 | Yamazaki et al. |
| 6,169,470 | B1 | * | 1/2001  | Ibata et al. ............ 336/83 |
| 6,236,538 | B1 |   | 5/2001  | Yamada et al. |
| 6,291,872 | B1 |   | 9/2001  | Wang et al. |
| 6,417,754 | B1 |   | 7/2002  | Bernhardt et al. |
| 6,445,271 | B1 | * | 9/2002  | Johnson ............... 336/200 |

FOREIGN PATENT DOCUMENTS

EP   0 725 407   8/1996

* cited by examiner

*Primary Examiner*—Elvin Enad
*Assistant Examiner*—Bernard Rojas
(74) *Attorney, Agent, or Firm*—Lee & Morse, P.C.

(57) ABSTRACT

An inductor used in a radio frequency integrated circuit is disclosed. The inductor includes a plurality of unit inductors each having a vertical spiral structure, wherein a vertical cross-section of at least one unit inductor selected from the plurality of unit inductors is an inverted trapezoid.

23 Claims, 10 Drawing Sheets

INDUCTOR FOR RADIO FREQUENCY INTEGRATED CIRCUIT

BACKGROUND OF THE INVENTION

1. Field of the Invention

The present invention relates to an inductor. More particularly, the present invention relates to an inductor used in a radio frequency integrated circuit (RFIC), and which has a multi-layer structure on the vertical and a spiral structure on the horizontal.

2. Description of the Related Art

An inductor is a passive device generally used in an RFIC. Since an inductor occupies the largest area in an RFIC, and is influenced by leakage of a substrate of the RFIC, it is difficult to obtain good leakage current characteristics for the circuit, which results in deterioration of communication quality.

Inductors also operate as passive devices used for impedance matching in RFICSs, as high quality factors of resonance tanks (L-C) that are used in voltage controlled oscillators (VCOs), and are important in reducing phase noise. However, it is difficult to manufacture an inductor having a high quality factor using a complementary metal oxide semiconductor (CMOS) process because of leakage of the substrate.

Accordingly, various methods of manufacturing inductors having a high quality factor have been studied. For example, an inductor having a high quality factor may be manufactured according to methods such as using a high resistance substrate, forming a thick oxide layer on a substrate to increase a gap between the substrate and the inductor, etching a substrate under an inductor after forming the inductor, and shielding a current from leaking into a substrate by forming a ground metal layer on the substrate.

However, each of these methods for manufacturing inductors requires an additional CMOS process, thereby increasing the cost of manufacturing the inductors.

Meanwhile, considering that the manufacturing cost of an inductor is proportional to the area thereof, an inductor that occupies the largest area in an RFIC according to the prior art presents a large cost burden.

Inductance of an inductor may be increased by increasing the turn number of the inductor. However, when this method is used, the quality factor Q of the inductor is reduced due to conductivity loss, which, combined with an effect caused by coupling the inductor to a substrate, results in reduction of the resonance frequency of the inductor, and thus the utilization range of the inductor is reduced.

For example, in a spiral inductor manufactured using a 0.18 µm CMOS process and having a width of 15 µm, a gap of 1.5 µm between wound wirings, a conductor thickness of 2 µm, and an inside diameter of 60 µm, when a turn number, or number of times the wiring is wound, is 3.5, the quality factor Q of the inductor is 6.5 in a range of 2 GHz, the inductance is 3.8 nH, and the resonance frequency is 6 GHz. However, when the turn number is increased to 7.5, although the inductance is increased to 17.6 nH, the quality factor Q is reduced to 2.5, and the resonance frequency is reduced to 3 GHz.

It is difficult to embody an inductor model fit for the physical and structural characteristics of circuit design because of effects such as coupling among conductive lines of the inductor, coupling of the conductive lines to a silicon substrate, and a lossy substrate.

FIG. 1 illustrates a general spiral inductor 10 used in an RFIC and an equivalent circuit thereof. Referring to FIG. 1, reference character $L_S$ denotes the total inductance obtained by summing a self-inductance of the spiral inductor 10 and metal inductances among metal lines of the spiral inductor. Reference character $R_S$ denotes the total resistance obtained by summing a direct current (DC) resistance of the spiral inductor 10 and an alternating current (AC) resistance affected by an ultra radio frequency skin effect. Reference character $C_S$ denotes a parasitic capacitance of a parasitic capacitor formed among the metal lines of the spiral inductor 10 and $C_P$ denotes a parasitic capacitance of a parasitic capacitor formed between the spiral inductor 10 and a silicon substrate. The parasitic capacitance $C_P$ is calculated from the thickness of an insulating layer formed between the spiral inductor 10 and the silicon substrate. Reference character $R_P$ denotes modeling of an ultra radio frequency leakage effect.

The entire quality factor Q of the equivalent circuit shown in FIG. 1 is calculated using Equation 1:

$$Q(qualityfactor) = \frac{MagneticEnergy(Em) - ElectricEnergy(Ee)}{EnergyLoss(Eloss)} \quad (1)$$

wherein the magnetic energy (Em), the electric energy (Ee), and the energy loss (Eloss) are calculated using Equations 2, 3, and 4, respectively:

$$Em = \frac{V^2 \varpi Ls}{2[(\varpi Ls)^2 + Rs^2]} \quad (2)$$

$$Ee = \frac{V^2 \varpi (Cs + Cp)}{2} \quad (3)$$

$$Eloss = \frac{V^2}{2}\left[\frac{1}{Rp} + \frac{Rs}{(\varpi Ls)^2 + Rs^2}\right] \quad (4)$$

As may be seen in Equations 2, 3, and 4, as the conductor resistance $R_S$ and the parasitic capacitances $C_S$ and $C_P$ of the parasitic capacitors formed by coupling decrease, the magnetic energy (Em) increases, and the electric energy (Ee) and the energy loss (Eloss) decrease. Referring to Equation 1, in this case, the quality factor Q increases.

FIG. 2 illustrates an inductor having a horizontal multi-layer structure of the prior art. In FIG. 2, reference numeral 100 denotes a substrate, reference numerals 101 and 102 denote interlayer insulating layers, and reference character 1A denotes a lead wiring connected to first conductive layer patterns 1.

In the inductor shown in FIG. 2, the first conductive layer patterns 1 are connected to second conductive layer patterns 2 via contact holes 3. Thus, the thickness of the entire conductive layer constituting the inductor is increased, which reduces a resistance $R_S$ of the conductive layer. In addition, since a lead wiring 2A is formed under the first conductive layer patterns 1, the number of conductive layers is reduced. The lead wiring 2A is connected to one of the first conductive layer patterns 1 via a lead contact hole 3A.

FIG. 3 illustrates a spiral inductor having a vertical multi-layer structure of the prior art, which was proposed to overcome the limits of a planar structure. In FIG. 3, reference numerals 201, 205, and 207 denote first, second and third single loop type inductors, respectively. Reference numerals 202 and 203 denote an outer end and inner end of the first single loop type inductor 201, respectively. Reference numeral 204 denotes an inner end of the second single loop type inductor 205. The inner end 203 of the first single loop type inductor 201 is connected to the inner end 204 of the second single loop type inductor 205 via a cross contact 206. Reference numeral 208 denotes a vertical direction contact via connecting the second single loop type inductor 205 to the third single loop type inductor 207.

As described above, in an inductor according to the prior art, as the thickness of metal layers increases, it may be possible to expect the effect that the quality factor Q of the inductor increases. However, because of couplings between the metal layers and between the first metal layer (bottom metal layer) and the silicon substrate of the inductor of the prior art, the quality factor Q and inductance of the inductor may be reduced, and the frequency range available for the inductor may be limited.

SUMMARY OF THE INVENTION

In an effort to solve these and other problems, an inductor having a high quality factor Q and occupying a small area in an RFIC is provided.

According to a feature of an embodiment of the present invention, there is provided an inductor including a plurality of unit inductors each having a vertical spiral structure, wherein a vertical cross-section of at least one unit inductor selected from the plurality of unit inductors is an inverted trapezoid.

In the inductor above, a vertical cross-section of the remaining unit inductors may have an inverted trapezoid structure. Alternatively, the vertical cross-section of the remaining unit inductors may have an inverted trapezoid, circular, triangular, rectangular, or elliptical structure.

It is preferable that each unit inductor of the plurality of unit inductors has a same size. However, one unit inductor selected from the plurality of unit inductors may have a size that is different from that of the rest.

In an embodiment of the present invention, the at least one unit inductor selected from the plurality of unit inductors includes multi-layer metal layers and conductive plugs that vertically connect the multi-layer metal layers, wherein each layer of the multi-layer metal layers formed between a top layer of the multi-layer metal layers and a bottom layer of the multi-layer metal layers includes two metal layers, and metal layers of the multi-layer metal layers formed under the top layer of the multi-layer metal layers do not overlap except at portions thereof connected via the conductive plugs. The metal layers of the multi-layer metal layers formed under the top layer of the multi-layer metal layers are preferably symmetrical. The top layer of the multi-layer metal layers is preferably connected to a metal layer under a top layer of a unit inductor adjacent to the selected unit inductor.

In an embodiment of the present invention, metal layers formed on at least one layer of the multi-layer metal layers formed between the top layer of the multi-layer metal layers and the bottom layer of the multi-layer metal layers have a same length, thickness, and width. However, at least one of a length, thickness, and width of metal layers formed on at least one layer of the multi-layer metal layers formed between the top layer of the multi-layer metal layers and the bottom layer of the multi-layer metal layers may be different from a respective length, thickness, and width of the others. Alternatively, metal layers formed between the top layer of the multi-layer metal layers and the bottom layer of the multi-layer metal layers may have a same length, thickness, and width. However, at least one of a length, thickness, and width of metal layers formed on different layers of the multi-layer metal layers formed between the top layer of the multi-layer metal layers and the bottom layer of the multi-layer metal layers is different from a respective length, thickness, and width of the others.

Preferably, the conductive plugs have the same length. However, conductive plugs on different layers may have different lengths.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
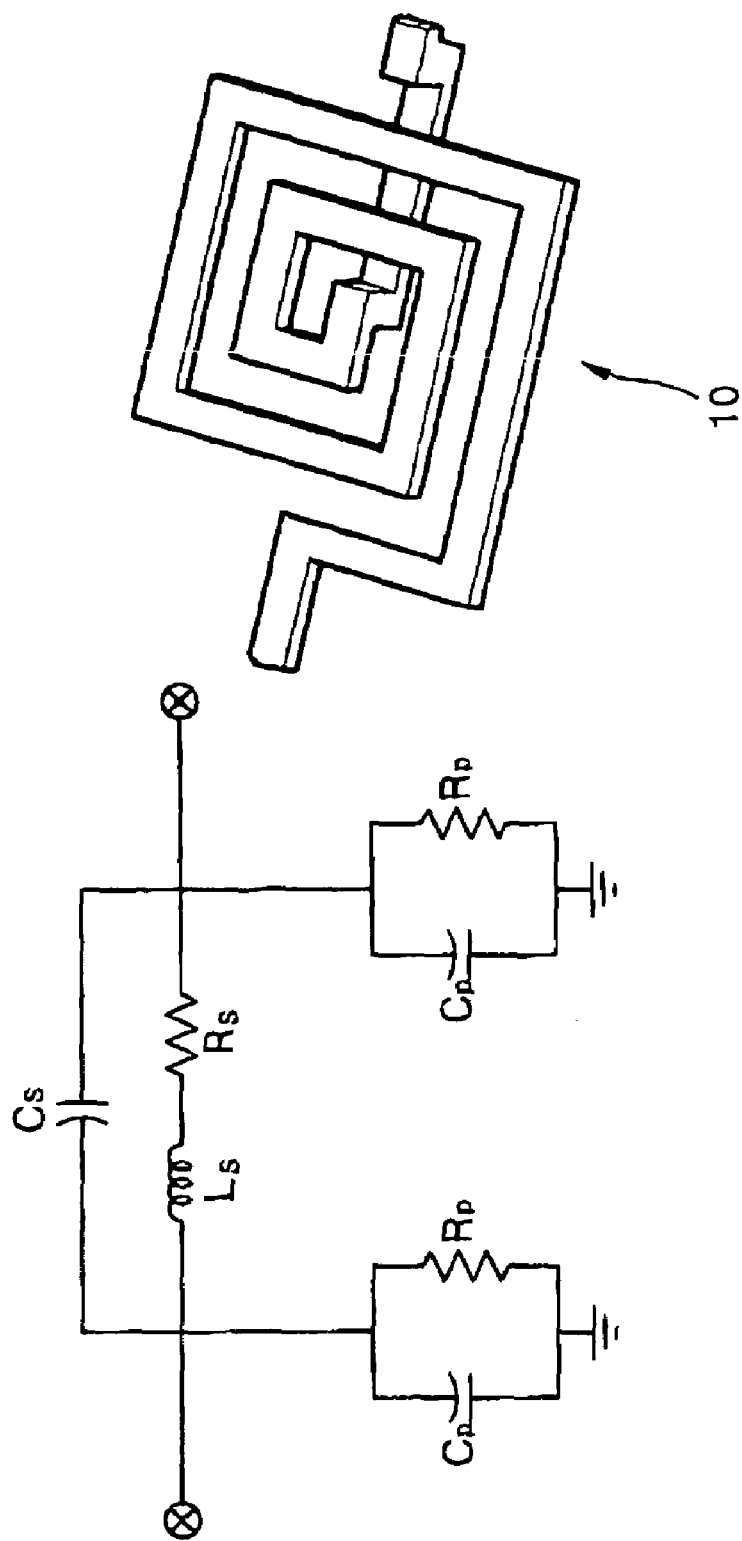
FIG. 1 illustrates a perspective view and an equivalent circuit diagram of a general inductor used in an RFIC according to the prior art.
Figure 2:
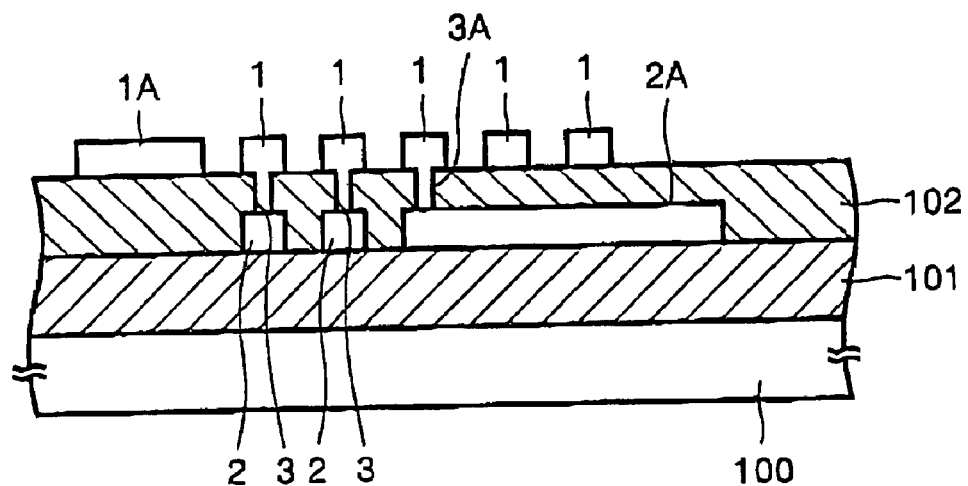
FIG. 2 illustrates a cross-sectional view of an inductor used in an RFIC according to the prior art.
Figure 3:
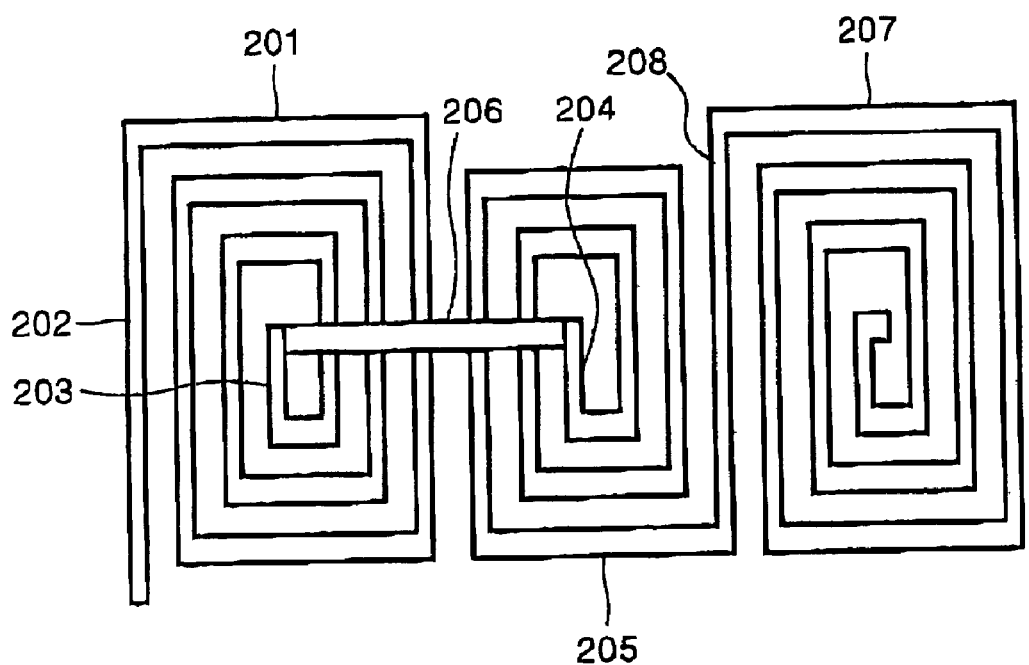
FIG. 3 illustrates a plane view of an inductor used in an RFIC according to different prior art.

Korean Patent Application No. 2002-55634, filed on Sep. 13, 2002, and entitled: "Inductor For Radio Frequency Integrated Circuit," is incorporated by reference herein in its entirety.

An inductor used in an RFIC, according to embodiments of the present invention, will be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thicknesses of layers or regions are exaggerated for clarity, and like numbers refer to like elements throughout.

An inductor according to an embodiment of the present invention solves disadvantages of a conventional inductor having a horizontal structure. An inductor according to an embodiment of the present invention may be characterized in that multi-layer metal layers stacked on a substrate are interconnected through via holes and geometrical forms of unit inductors have an inverted trapezoid structure, and the unit inductors are horizontally connected in a spiral form.

<First Embodiment>

Figure 4:
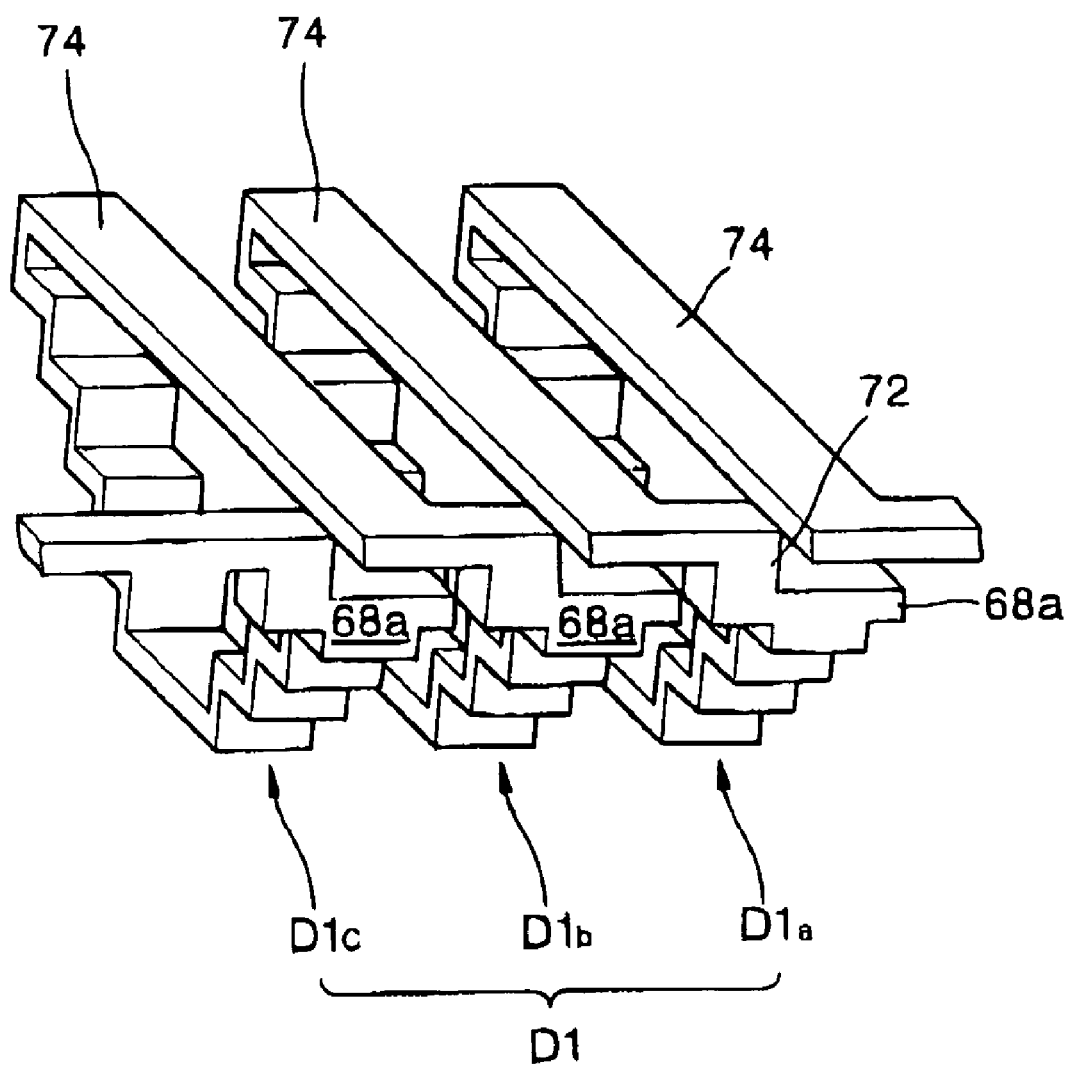
FIG. 4 illustrates a perspective view of a first inductor used in an RFIC according to a first embodiment of the present invention.

FIG. 4 illustrates a perspective view of a first inductor used in an RFIC according to a first embodiment of the present invention. A first inductor according to a first embodiment of the present invention includes a plurality of unit inductors, each having an inverted trapezoid structure and a same size.

In particular, referring to FIG. 4, a first inductor D1 includes first, second, and third unit inductors D1a, D1b, and D1c, respectively, which are horizontally connected in a spiral form. If necessary, the first inductor D1 may include additional unit inductors. Each of the first, second, and third unit inductors D1a, D1b, and D1c has an inverted trapezoid structure, and is formed of multi-layer metal layers, arranged such that distances between the metal layers in each layer of metal layers increase in an upward direction along the unit inductor.

For example, although not illustrated, if a layer of metal layers, x, for example, is positioned above any other layer of metal layers, x-n, for example, then a distance between the metal layers in the layer of metal layers x is greater than a distance between the metal layers in the layer of metal layers x-n, which is positioned below the layer of metal layers x. Also, metal layers in a layer of metal layers are vertically connected to metal layers in another layer of metal layers through via holes. Thus, in a unit inductor, portions thereof connecting a bottom metal layer to a top metal layer form a stair pattern. In addition, it is preferable that the thickness and width of the metal layers in each layer of metal layers are uniform.

Referring again to FIG. 4, a sixth metal layer 74 of one of the first, second, and third unit inductors D1a, D1b, and D1c, e.g., the second unit inductor D1b, is connected to a fifth metal layer 68a of an adjacent unit inductor, i.e., the first unit inductor D1a. Here, the fifth metal layer 68a of the first unit inductor D1a is connected to the sixth metal layer 74 of the second unit inductor D1b via a conductive plug 72 filling a via hole (not shown). As shown in FIG. 4, the first, second, and third unit inductors D1a, D1b, and D1c are horizontally arranged linearly with a predetermined distance therebetween. Thus, in order to connect the fifth metal layer 68a of the first unit inductor D1a to the sixth metal layer 74 of the second unit inductor D1b as described above, the sixth metal layer 74 of the second unit inductor D1b extends a predetermine distance toward the fifth metal layer 68a of the first unit inductor D1a. The fifth metal layer 68a of the first unit inductor D1a also extends the same distance toward the sixth metal layer 74 of the second unit inductor D1b. The extending portion of the sixth metal layer 74 of the second unit inductor D1b is connected to the extending portion of the fifth metal layer 68a of the first unit inductor D1a via the conductive plug 72. As a result, the sixth metal layer 74 of the second unit inductor D1b is connected to the fifth metal layer 68a of the first unit inductor D1a within a space between the first and second unit inductors D1a and D1b. This connection structure is also applied to the connection of the second and third unit inductors D1b and D1c.

Insulating layers (not shown) are formed in-between the first, second, and third unit inductors D1a, D1b, and D1c, and enclose the metal layers constituting the first, second, and third unit inductors D1a, D1b, and D1c and conductive plugs connecting the metal layers, which will be explained in greater detail later.

Vertical cross-sectional structures of the first, second, and third unit inductors D1a, D1b, and D1c will now be described. However, because the first, second, and third unit inductors D1a, D1b, and D1c have the same structure, only the vertical cross-sectional structures of the first and second unit inductors D1a and D1b will be described.

First, the vertical cross-sectional structure of the first unit inductor D1a will be explained.

Figure 5:
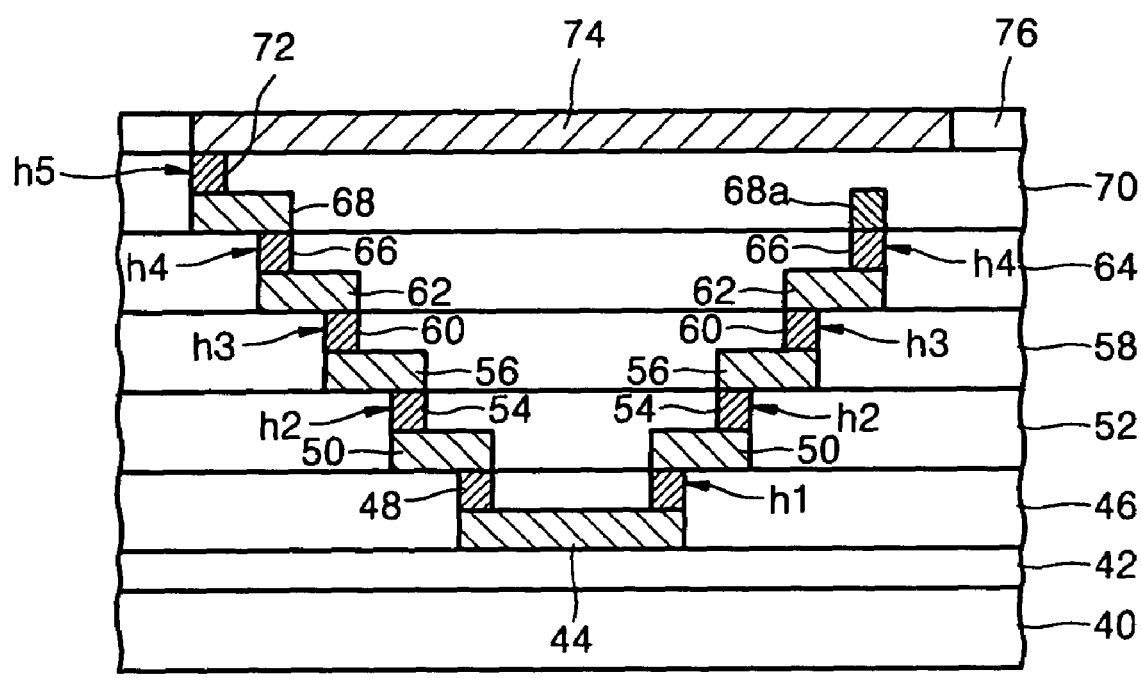
FIGS. 5 and 6 illustrate vertical cross-sectional views of first and second unit inductors included in the first inductor shown in FIG. 4.

Referring to FIG. 5, an insulating layer 42 is formed on a substrate 40, e.g., a silicon substrate. The insulating layer 42 is, for example, a silicon oxide layer which increases a gap between the substrate 40 and an inductor formed on the substrate 40 in order to reduce coupling of the inductor to the substrate 40. A first metal layer 44 is formed in a predetermined area of the insulating layer 42. A first interlayer insulating layer 46 is formed on the insulating layer 42 to cover the first metal layer 44. First via holes h1 are formed in the first insulating layer 46 to expose portions of outer ends of the first metal layer 44, and are filled with first conductive plugs 48. It is preferable that the first conductive plugs 48 are formed of the same material as the first metal layer 44 in order to minimize contact resistance between the first metal layer 44 and second metal layers 50 formed over the first metal layer 44. If the first metal layer 44 and the second metal layers 50 are formed of different materials, another conductive material may be interposed between the first conductive plugs 48 and the first metal layer 44 and/or the first conductive plugs 48 and the second metal layers 50. This may be applied to metal layers 56, 62, 68, and 74 formed over the second metal layers 50, and to conductive plugs 54, 60, 66, 68a, and 72 connecting the metal layers 56, 62, 68, and 74 as well as to conductive plugs connecting metal layers constituting a second inductor that will be described in detail in a second embodiment.

The second metal layers 50, which contact the first conductive plugs 48, are formed on the first interlayer insulating layer 46 above portions of both ends of the first metal layer 44. The second metal layers 50 are formed over the first conductive plugs 48, and extend outwardly beyond both ends of the first metal layer 44. In other words, the second metal layers 50 are symmetrically formed to be centered around and above the first metal layer 44, overlapping portions of both ends of the first metal layer 44, thereby contacting the first conductive plugs 48, and extending beyond both ends of the first metal layer 44. As a result, the distance between inner, facing ends of the second metal layers 50 is shorter than the distance between both ends of the first metal layer 44, while the distance between outer ends of the second metal layers 50 is longer than the distance between both ends of the first metal layer 44.

A second interlayer insulating layer 52 is formed on the first interlayer insulating layer 46 to cover the second metal layers 50. Second via holes h2 are formed in the second interlayer insulating layer 52 to expose portions of outer ends of the second metal layers 50 and are filled with second conductive plugs 54. Third metal layers 56 are formed on predetermined areas of the second interlayer insulating layer 52 to have a predetermined distance therebetween, and to contact the second conductive plugs 54. The third metal layers 56 are formed under the same conditions as the second metal layers 50 and contact the second conductive plugs 54 under the same conditions that the second metal layers 50 contact the first conductive plugs 48, so that a distance between inner, facing ends of the third metal layers 56 is longer than the distance between the inner, facing ends of the second metal layers 50 and shorter than the distance between the outer ends of the second metal layers 50. The distance between outer ends of the third metal layers 56 is much greater than the distance between the outer ends of the second metal layers 50. Also, the third metal layers 56 are symmetrically formed to be centered around and above the first metal layer 44.

A third interlayer insulating layer 58 is formed on the second interlayer insulating layer 52 to cover the third metal layers 56. Third via holes h3 are formed in the third interlayer insulating layer 58 to expose portions of outer ends of the third metal layers 56, and are filled with third conductive plugs 60. The third via holes h3, and therefore the third conductive plugs 60, are spaced farther apart than the second via holes h2 and the second conductive plugs 54.

Fourth metal layers 62 are formed on predetermined areas of the third interlayer insulating layer 58 to have a predetermined distance therebetween, and to contact the third conductive plugs 60. The fourth metal layers 62 are formed under the same conditions as the third metal layers 56, and contact the third conductive plugs 60 under the same conditions that the third metal layers 56 contact the second conductive plugs 54, so that a distance between inner, facing ends of the fourth metal layers 62 is longer than the distance between the inner, facing ends of the third metal layers 56 and shorter than the distance between the outer ends of the third metal layers 56. The fourth metal layers 62 are also symmetrically formed to be centered around and above the first metal layer 44. Preferably, the second, third, and fourth metal layers 50, 56, and 62 have the same thickness and length.

As described above, since the distance between metal layers formed over the first metal layer 44 gets longer in an upward direction along a unit inductor, metal layers in upper positions do not overlap metal layers in lower positions except at portions thereof connected via the conductive plugs. As a result, a parasitic capacitance due to coupling among metal layers in an inductor having a vertical structure may be prevented.

A fourth interlayer insulating layer 64 is formed on the third interlayer insulating layer 58 to cover the fourth metal layers 62. Fourth via holes h4 are formed in the fourth interlayer insulating layer 64 to expose portions of outer ends of the fourth metal layers 62, and a distance between the fourth via holes h4 is longer than the distance between the third via holes h3. The fourth via holes h4 are filled with fourth conductive plugs 66. Fifth metal layers 68 and 68a are formed on predetermined areas of the fourth interlayer insulating layer 64 including the fourth conductive plugs 66, and are formed to be symmetrical to the first metal layer 44. A distance between the fifth metal layers 68 and 68a is greater than the distance between the fourth metal layers 62. The fifth metal layers 68 and 68a and the fourth metal layers 62 are connected via the fourth conductive plugs 66.

The fifth metal layer 68a on a right side of the first unit inductor D1a is connected to the second unit inductor D1b, as will be described later with reference to FIG. 6. The fifth metal layer 68a may have the same thickness and length as the fifth metal layer 68 on a left side of the first unit inductor D1a. A fifth interlayer insulating layer 70 is formed on the fourth interlayer insulating layer 64 to cover the fifth metal layers 68 and 68a. A fifth via hole h5 is formed in the fifth interlayer insulating layer 70 to expose a portion of an outer end of the fifth metal layer 68 on the left side of the first unit inductor D1a and is filled with a fifth conductive plug 72.

A sixth metal layer 74 is formed on the fifth interlayer insulating layer 70 to be connected to the fifth conductive plug 72. An end of the sixth metal layer 74 is formed over the fifth conductive plug 72, and the sixth metal layer 74 is formed to have a length corresponding to a distance between outer ends of the fifth metal layers 68 and 68a. A sixth interlayer insulating layer 76 is formed around the sixth metal layer 74 on the fifth interlayer insulating layer 70.

As described above, the first unit inductor D1a is composed of the first, second, third, fourth, fifth, and sixth metal layers 44, 50, 56, 62, 68 and 68a, and 74, respectively, and the first, second, third, fourth, and fifth conductive plugs 48, 54, 60, 66, and 72. Thus, the first unit inductor D1a has an inverted trapezoid structure with sides that correspond to stairs, which are symmetrical with respect to the first metal layer 44. As a result, coupling between the substrate 40 and the first, second, third, fourth, fifth, and sixth metal layers 44, 50, 56, 62, 68 and 68a, and 74, is reduced.

The first unit inductor D1a is shown in FIG. 5 having an inverted trapezoid structure. However, the first unit inductor D1a is not limited to having a structure of an inverted trapezoid, but may be triangular, rectangular, circular, or elliptical. In this case, it is preferable that the first unit inductor D1a is formed so that overlapping areas of metal layers are minimized to minimize coupling among the metal layers.

Figure 6:
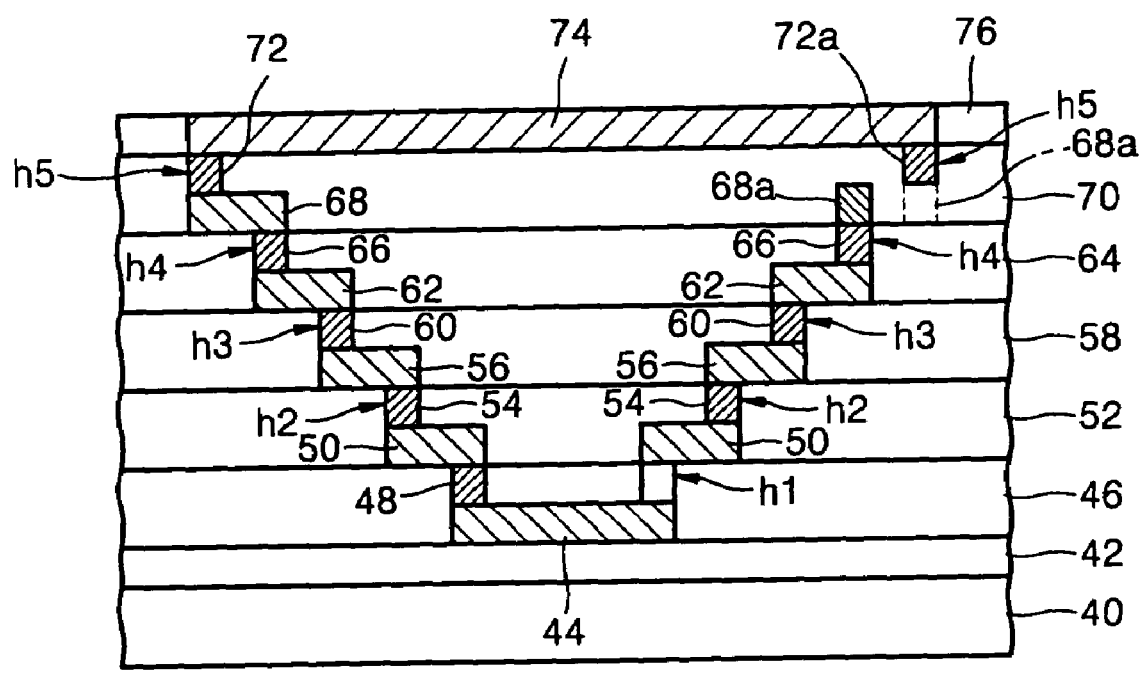

FIG. 6 illustrates a cross-sectional view of the second unit inductor D1b of FIG. 4. Here, the second unit inductor D1b has the same structure and shape as the first unit inductor D1a shown in FIG. 5 except that an additional fifth via hole h5 is formed in the fifth interlayer insulating layer 70 at a right side of the second unit inductor D1b, and is filled with a conductive plug 72a. The conductive plug 72a is formed between a fifth metal layer 68a and a sixth metal layer 74 to thereby connect the fifth metal layer 68a and the sixth metal layer 74. The conductive plug 72a is formed with the fifth conductive plug 72. As previously mentioned, the conductive plug 72a also connects the sixth metal layer 74 of the second unit inductor D1b to the fifth metal layer 68a of the first unit inductor D1a within a space between the first and second unit inductors D1a and D1b.

<Second Embodiment>

In the second embodiment of the present invention, unit inductors are formed to have different sizes and are arranged according to the sizes thereof to minimize effects between metal layers and a substrate, as well as between metal layers of adjacent unit inductors.

Figure 7:
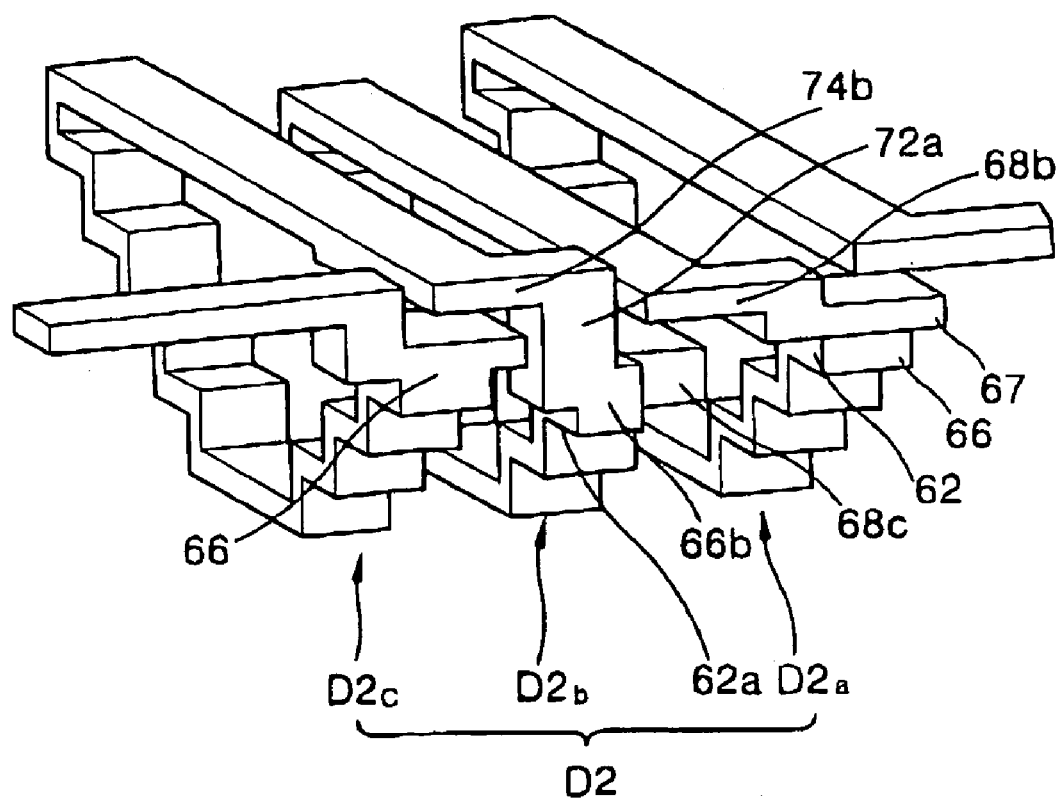
FIG. 7 illustrates a perspective view of a second inductor used in an RFIC according to a second embodiment of the present invention.

Referring to FIG. 7, a second inductor D2 having a vertical spiral structure includes fourth, fifth, and sixth unit inductors D2a, D2b, and D2c, which each have an inverted trapezoid structure and are spirally arranged in a horizontal direction. However, the fifth unit inductor D2b is smaller than the fourth and sixth unit inductors D2a and D2c. Thus, a fifth metal layer 68b of the fifth unit inductor D2b is connected to a fourth metal layer 62 of the fourth unit inductor D2a via a fourth conductive plug 66 and a fifth metal layer 67 of the fourth unit inductor D2a. A fourth metal layer 62a of the fifth unit inductor D2b is connected to a sixth metal layer 74b of the sixth unit inductor D2c via a fourth conductive plug 66b, a fifth metal layer 68c, and a fifth conductive plug 72a within a space between the fifth unit inductor D2b and the sixth unit inductor D2c.

Vertical cross-sectional structures of the fourth, fifth, and sixth unit inductors D2a, D2b, and D2c will now be described, beginning with the vertical cross-sectional structure of the fourth unit inductor D2a.

Figure 8:
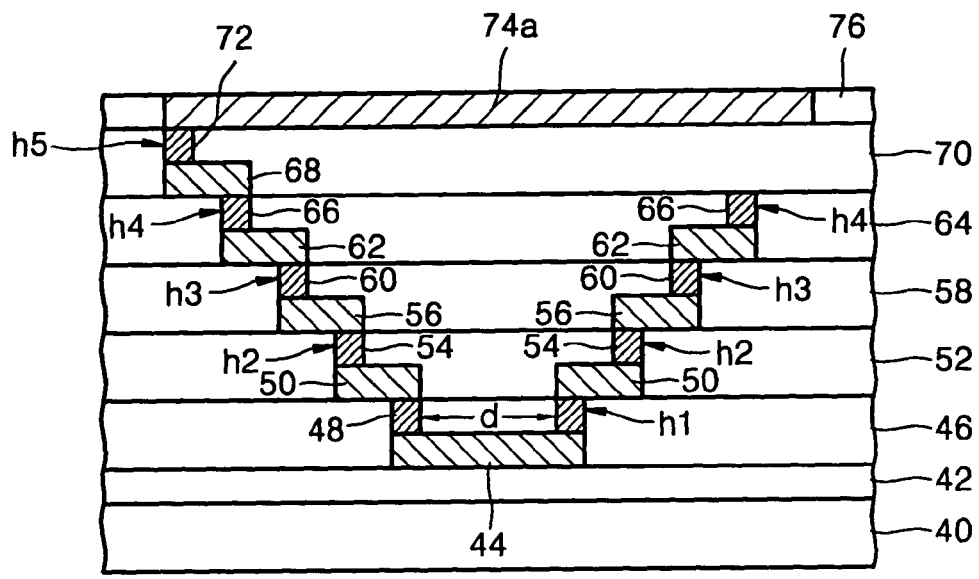
FIGS. 8 through 10 illustrate vertical cross-sectional views of third through fifth unit inductors included in the second inductor shown in FIG. 7.

Referring to FIG. 8, an insulating layer 42 is formed on a substrate 40, and a first metal layer 44 is formed on a predetermined area of the insulating layer 42. A first interlayer insulating layer 46 is formed on the insulating layer 42 to cover the first metal layer 44. First via holes h1 are formed in the first interlayer insulating layer 46 to have a predetermined distance d therebetween, thereby exposing portions of both outer ends of the first metal layer 44. The vertical cross-sectional structure from a second interlayer insulating layer 52 to a fourth interlayer insulating layer 64 is the same as that described in the first embodiment, and thus will not be explained herein.

A fifth metal layer 68 is formed on the fourth interlayer insulating layer 64. A portion of right end of the fifth metal layer 68 contacts a fourth conductive plug 66 filling a fourth via hole h4 formed in the fourth interlayer insulating layer 64 at a left side of the fourth unit inductor D2a. A fourth via hole h4 is also formed in the fourth interlayer insulating layer 64 at a right side of the fourth unit inductor D2a to expose a portion of a right most end of fourth metal layers 62, and is filled with a fourth conductive plug 66. A fifth interlayer insulating layer 70 is formed on the fourth interlayer insulating layer 64 to cover the fifth metal layer 68. A fifth via hole h5 is formed in the fifth interlayer insulating layer 70 to expose a portion of a left end of the fifth metal layer 68, and is filled with fifth conductive plug 72. A sixth metal layer 74a is formed on the fifth interlayer insulating layer 70 to contact the fifth conductive plug 72, and to extend past a right most end of the fourth conductive plugs 66. A sixth interlayer insulating layer 76 is formed around the sixth metal layer 74a. The fourth unit inductor D2a is connected to the fifth unit inductor D2b via the fourth conductive plugs 66.

A vertical cross-sectional view of the fifth unit inductor D2b, which is smaller than the fourth and sixth unit inductors D2a and D2c, will now be described.

Figure 9:
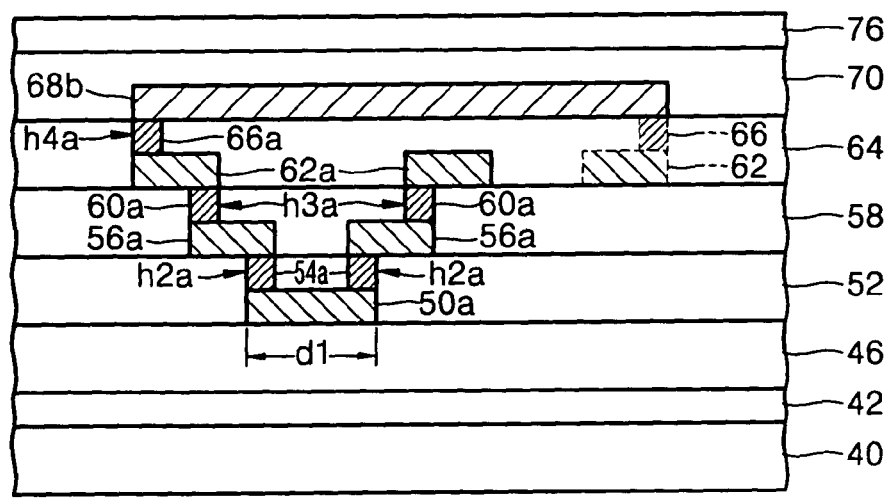

Referring to FIG. 9, a second metal layer 50a is formed on a first interlayer insulating layer 46. Here, a position in which the second metal layer 50a is formed corresponds to a space between the second metal layers 50 of the fourth unit inductor D2a of FIG. 8, and similarly to a space between second metal layers of the sixth unit inductor D2c. It is preferable that a length d1 of the second metal layer 50a is shorter than the distance d between the first conductive plugs 48 connecting the first metal layer 44 to the second metal layers 50 of the fourth unit inductor D2a shown in FIG. 8. A second interlayer insulating layer 52 is formed on the first interlayer insulating layer 46 to cover the second metal layer 50a. Second via holes h2a are formed in the second interlayer insulating layer 52 to expose portions of outer ends of the second metal layer 50a and are filled with second conductive plugs 54a. Third metal layers 56a are formed on the second interlayer insulating layer 52 to have a predetermined distance therebetween. Portions of inner ends of the third metal layers 56a are respectively connected to second conductive plugs 54a. The distance between the third metal layers 56a is shorter than the length d1 of the second metal layer 50a while the distance between outer ends of the third metal layers 56a is much longer than the length d1 of the second metal layer 50a. However, it is preferable that the distance between outer ends of the third metal layers 56a is shorter than the distance between the third metal layers 56 of the fourth and fifth unit inductors D2a and D2c of FIGS. 8 and 10. Accordingly, it is possible to prevent metal layers formed on an insulating layer of the fifth unit inductor D2b from being arranged too closely to metal layers of the fourth and sixth unit inductors D2a and D2c. As a result, horizontal coupling among adjacent unit inductors may be minimized.

A third interlayer insulating layer 58 is formed on the second interlayer insulating layer 52 to cover the third metal layers 56a. Third via holes h3a are formed in the third interlayer insulating layer 58 to expose portions of outer ends of the third metal layers 56a. Thus, a distance between the third via holes h3a is much longer than the distance between the second via holes h2a and smaller than the distance between the third metal layers 56 of the fourth and fifth unit inductors D2a and D2c of FIGS. 8 and 10. The third via holes h3a are filled with third conductive plugs 60a. Fourth metal layers 62a are formed on the third interlayer insulating layer 58 to have a predetermined distance therebetween, and portions of inner ends thereof are connected to the third conductive plugs 60a. It is preferable that a distance between outer ends of the fourth metal layers 62a is shorter than the distance between the fourth metal layers 62 of the fourth and sixth unit inductors D2a and D2c of FIGS. 8 and 10. The fourth metal layer 62a on a right side of the fifth unit inductor D2b is connected to a sixth metal layer 74b of the sixth unit inductor D2c shown in FIG. 10. A fourth interlayer insulating layer 64 is formed on the third interlayer insulating layer 58 to cover the fourth metal layers 62a. A fourth via hole h4a is formed in the fourth interlayer insulating layer 64 to expose a portion of a left most end of the fourth metal layers 62a on a left side of the fifth unit inductor D2b, and is filled with a fourth conductive plug 66a. A fifth metal layer 68b is formed on the fourth interlayer insulating layer 64 to be connected to the fourth conductive plug h4a, and to extend a predetermined distance to the right of the fourth conductive plug h4a. It is preferable that a length of the fifth metal layer 68b is shorter than the distance between the fourth via holes h4 of the fourth and sixth unit inductors D2a and D2c of FIGS. 8 and 10.

As indicated by dotted lines in FIG. 9, a fourth metal layer 62 of the fourth unit inductor D2a is formed on the third interlayer insulating layer 58 to be connected to the fifth metal layer 68b of the fifth unit inductor D2b. The fourth metal layer 62 of the fourth unit inductor D2a and the fifth metal layer 68b of the fifth unit inductor D2b are connected via the fourth conductive plug 66 filling the fourth via hole h4 through which a portion of the right most end of the fourth metal layers 62 is exposed in the fourth unit inductor D2a.

A fifth interlayer insulating layer 70 is formed on the fourth interlayer insulating layer 64 to cover the fifth metal layer 68b, and a sixth interlayer insulating layer 76 is formed on the fifth interlayer insulating layer 70.

The vertical cross-sectional structure of the sixth unit inductor D2c will now be described with reference to FIG. 10.

Figure 10:
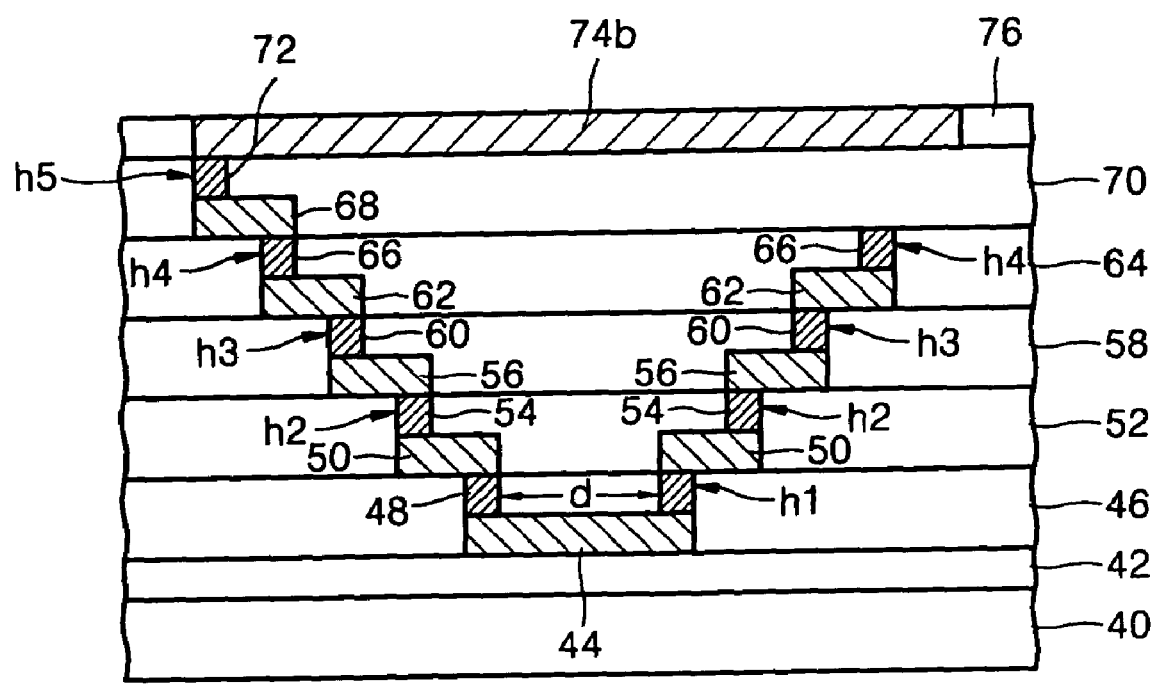

As shown in FIG. 10, the vertical cross-sectional structure of the sixth unit inductor D2c from a substrate 40 to fourth conductive plugs 66 is the same as that of the fourth unit inductor D2a shown in FIG. 8, and thus will not be described herein.

Referring to FIG. 10, a fifth metal layer 68 is formed on the fourth interlayer insulating layer 64 to be connected to the fourth conductive plug 66 on a left side of the sixth unit inductor D2c. A fifth interlayer insulating layer 70 is formed on the fourth interlayer insulating layer 64 to cover the fifth metal layer 68. A fifth via hole h5 is formed in the fifth interlayer insulating layer 70 to expose a portion of a left end of the fifth metal layer 68 and is filled with a fifth conductive plug 72. A sixth metal layer 74b is formed on the fifth interlayer insulating layer 70 to be connected to the fifth conductive plug 72. The sixth metal layer 74b extends beyond the fourth via holes h4 and is connected at a right end thereof to the fourth metal layer 62a of the fifth unit inductor D2b of FIG. 9.

Since the second inductor according to the second embodiment of the present invention includes unit inductors having different sizes, coupling of metal layers to the substrate 40 is reduced further than in the first embodiment.

Both the first inductor and the second inductor according to the first and second embodiments of the present invention have a lower capacitance ($C_P$) and ultra radio frequency ($R_P$) than an inductor according to the prior art. Therefore, a quality factor Q of an inductor according to the present invention may be higher than that of an inductor according to the prior art. Also, in the second inductor according to the second embodiment of the present invention, small areas of unit inductors overlap horizontally, and thus a parasitic capacitance $C_S$ is reduced. As a result, the electric energy (Ee) and the energy loss (Eloss) of the second inductor may be reduced, which increases the quality factor Q thereof.

In order to verify characteristics of the first and second inductors according to the present invention, the inventor of the present invention carried out a simulation for analyzing three-dimensional structures of the first and second inductors according to the first and second embodiments of the present invention and the horizontal spiral inductor shown in FIG. 1 under similar conditions, and compared quality factors of the first and second inductors according to the present invention with a quality factor of the inductor according to the prior art.

In the simulation described above, a width of metal layers constituting an inductor was set to 3 μm, a gap among turns of the metal layers was set to 4 μm, a thickness of the metal layers was set to 1 μm, and a total length of the metal layers was set to 230 μm.

Figure 11:
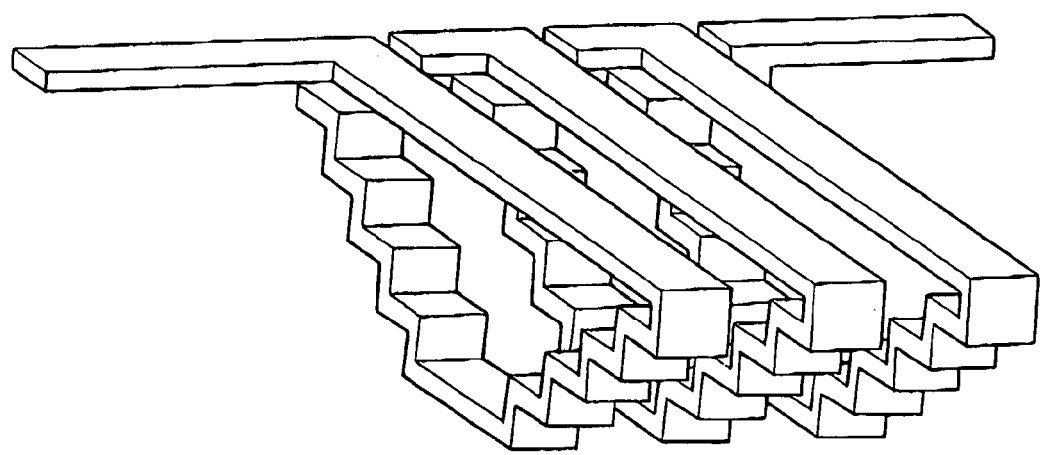
FIG. 11 illustrates a three-dimensional structure of the first inductor according to the first embodiment of the present invention, which was used in a simulation carried out for comparing the present invention with the prior art.

FIG. 11 illustrates the three-dimensional structure of the first inductor according to the first embodiment of the present invention used in the simulation described above, and FIG. 12 is a graph illustrating the results of the simulation.

Figure 12:
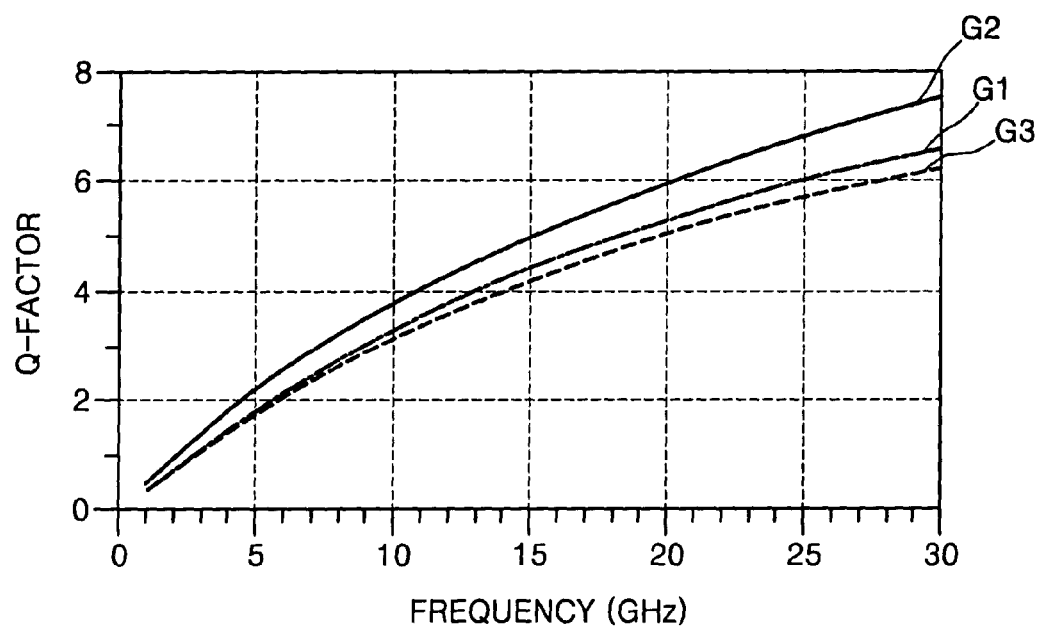
FIG. 12 is a graph illustrating results of a simulation carried out for comparing the first and second inductors according to the first and second embodiments of the present invention with an inductor according to the prior art.

In FIG. 12, first and second graphs G1 and G2 illustrate results of the simulation obtained using the first and second inductors of the present invention, respectively, and third graph G3 illustrates results of the simulation obtained using the inductor shown in FIG. 1.

As may be seen in the first, second, and third line graphs G1, G2, and G3, a quality factor Q increases with an increase in frequency. At a same frequency, the second inductor according to the present invention has the highest quality factor Q, the first inductor has the second highest quality factor Q, and the inductor shown in FIG. 1 has the lowest quality factor Q.

The first and second inductors according to the present invention have an area of about 25×34 μm² and the inductor shown in FIG. 1 has an area of about 39×36 μm². Thus, areas of the first and second inductors according to the present invention are smaller than that of the inductor of the prior art shown in FIG. 1.

As described above, since an inductor according to embodiments of the present invention can be formed using a CMOS process of semiconductor manufacturing processes, an additional process is not required. Further, by minimizing parasitic components caused by coupling of an inductor to a substrate and by vertical and horizontal coupling among metal layers of the inductor, the quality factor of the inductor may be increased, thereby increasing the range of inductor device fields in which inductors of the present invention may be used.

Although a number of times metal layers of inductors according to the present invention are wound is the same as that of a horizontal multi-layer inductor according to the prior art, the horizontal area on which inductors of the present invention may be formed is smaller than that of the horizontal multi-layer inductor of the prior art. Moreover, as gate lengths are reduced and a number of stacked metal layers is increased due to developments in semiconductor manufacturing processes, an inductance of an inductor according to the present invention may be further increased.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

For example, it will be understood by those of ordinary skill in the art that lengths of metal layers of the first or second inductor according to first and second embodiments of the present invention may be different for each layer. Also, unit inductors of the second inductor may be formed in different shapes. For example, a fourth unit inductor may be an inverted trapezoid, a fifth unit inductor may be triangular, and a sixth unit inductor may be circular, rectangular, or elliptical. In addition, an inductor having a new structure may be formed by combining inductor structures proposed in the present invention and an existing inductor structure.

What is claimed is:

1. An inductor, comprising:
    a plurality of unit inductors, a vertical cross-section of at least one unit inductor of the plurality of unit inductors having a width that increases from a bottom surface of the at least one unit inductor to a top surface of the at least one unit inductor, the at least one unit inductor including a top metal layer extending across the width at the top surface; and
    means for connecting a unit inductor to an adjacent unit inductor in the plurality of unit inductors in a direction perpendicular to the top metal layer, wherein the means includes metal layers extended from the unit inductors adjacent to the means and a conductive plug for connecting the extended metal layers.

2. The inductor as claimed in claim 1, wherein a vertical cross-section of all of the plurality of unit inductors has a width that increases from a bottom surface to a top surface of the unit inductor and a top metal layer extending across the width at the top surface.

3. The inductor as claimed in claim 2, wherein each unit inductor of the plurality of unit inductors has a same size.

4. The inductor as claimed in claim 3, each unit inductor of the plurality of unit inductors comprises:
    a base metal layer at the bottom surface;
    a multi-layer metal layer including two metal segments separated by a distance along the width, the multi-layer metal layer being between the base metal layer and the top metal layer; and
    conductive plugs for vertically connecting adjacent metal layers.

5. The inductor as claimed in claim 2, wherein one unit inductor selected from the plurality of unit inductors has a size that is different from that of the rest.

6. The inductor as claimed in claim 5, wherein the at least one unit inductor selected from the plurality of unit inductors comprises:
    multi-layer metal layers; and
    conductive plugs that vertically connect the multi-layer metal layers, wherein layers of the multi-layer metal layers formed between top and bottom layers of the multi-layer metal layers include two metal layers, and metal layers of the multi-layer metal layers formed under the top layer of the multi-layer metal layers do not overlap except at portions thereof connected via the conductive plugs.

7. The inductor as claimed in claim 2, wherein each unit inductor of the plurality of unit inductors comprises:
a base metal layer at the bottom surface;
a multi-layer metal layer including two metal segments separated by a distance along the width, the multi-layer metal layer being between the base metal layer and the top metal layer; and
conductive plugs for vertically connecting adjacent metal layers.

8. The inductor as claimed in claim 7, wherein the top metal layer of the unit inductor is connected to the multi-layer metal layer of the adjacent unit inductor.

9. The inductor as claimed in claim 7, wherein each unit inductor further comprises at least two multi-layer metal layers between the base metal layer and the top metal layer, the metal segments of the at least two multi-layer metal layers only overlapping at portions thereof connected via the conductive plugs.

10. The inductor as claimed in claim 7, wherein one metal segment of the multi-layer metal layer extends along a length beyond the bottom metal layer.

11. The inductor as claimed in claim 1, wherein a vertical cross-section of remaining unit inductors has an inverted trapezoid, circular, triangular, rectangular, or elliptical structure.

12. The inductor as claimed in claim 11, each unit inductor of the plurality of unit inductors comprises:
a base metal layer at the bottom surface;
a multi-layer metal layer including two metal segments separated by a distance along the width, the multi-layer metal layer being between the base metal layer and the top metal layer; and
conductive plugs for vertically connecting adjacent metal layers.

13. The inductor as claimed in claim 1, wherein the at least one unit inductor comprises:
a base metal layer at the bottom surface;
a multi-layer metal layer including two metal segments separated by a distance along the width, the multi-layer metal layer being between the base metal layer and the top metal layer; and
conductive plugs for vertically connecting adjacent metal layers.

14. The inductor as claimed in claim 13, wherein at least one of a length, thickness, and width of metal layers formed on at least one layer of the multi-layer metal layers formed between the top layer of the multi-layer metal layers and the bottom layer of the multi-layer metal layers is different from a respective length, thickness, and width of the others.

15. The inductor as claimed in claim 13, wherein the conductive plugs have the same length.

16. The inductor as claimed in claim 13, wherein conductive plugs on different layers have different lengths.

17. The inductor as claimed in claim 13, wherein the at least one unit inductor further comprises at least two multi-layer metal layers between the base metal layer and the top metal layer, the metal segments of the at least two multi-layer metal layers only overlapping at portions thereof connected via the conductive plugs.

18. The inductor as claimed in claim 17, wherein the metal portions of the at least two multi-layer metal layers are symmetrical.

19. The inductor as claimed in claim 18, wherein the metal portions of the at least two multi-layer metal layers have a same length, thickness, and width.

20. The inductor as claimed in claim 18, wherein at least one of a length, thickness, and width of metal layers formed on different layers between the top layer of the multi-layer metal layers and the bottom layer of the multi-layer metal layers is different from a respective length, thickness, and width of the others.

21. The inductor as claimed in claim 17, wherein metal portions of the at least two multi-layer metal layers have a same length, thickness, and width.

22. The inductor as claimed in claim 13, wherein one metal segment of the multi-layer metal layer extends along a length beyond the bottom metal layer.

23. The inductor as claimed in claim 1, wherein the vertical cross-section of the at least one unit inductor of the plurality of unit inductors forms an inverted trapezoid.

* * * * *